United States Patent [19]

Minezaki

[11] 4,411,981
[45] Oct. 25, 1983

[54] METHOD FOR FORMING A PATTERN IN A THIN-FILM TRANSISTOR HAVING TELLURIUM SEMICONDUCTOR LAYER

[75] Inventor: Shigehiro Minezaki, Ikoma, Japan

[73] Assignee: Sharp Kabushiki Kaisha, Osaka, Japan

[21] Appl. No.: 238,102

[22] Filed: Feb. 25, 1981

[30] Foreign Application Priority Data

Feb. 28, 1980 [JP] Japan ................................. 55-24888

[51] Int. Cl.$^3$ ........................... C23F 1/02; G03C 5/00; H01L 21/00
[52] U.S. Cl. .................................... 430/299; 430/166; 430/318; 430/323; 430/326; 430/327; 430/329; 430/330; 430/331; 430/275
[58] Field of Search ............... 430/299, 318, 323, 327, 430/166, 167, 155, 157, 158, 329, 330, 326, 331, 275

[56] References Cited

U.S. PATENT DOCUMENTS

| | | | |
|---|---|---|---|
| 3,639,185 | 2/1972 | Colom et al. | 430/299 |
| 4,008,084 | 2/1977 | Ikeda et al. | 156/665 |
| 4,113,494 | 9/1978 | Hallman | 430/302 |
| 4,142,898 | 3/1979 | Izu | 430/318 |
| 4,271,257 | 6/1981 | Wacks et al. | 430/323 |
| 4,292,388 | 9/1981 | Ikeda et al. | 430/323 |
| 4,292,392 | 9/1981 | Ikeda et al. | 430/166 |
| 4,292,393 | 9/1981 | Wada et al. | 430/323 |
| 4,292,395 | 9/1981 | Wada et al. | 430/323 |
| 4,379,827 | 4/1983 | Hallman | 430/299 |

FOREIGN PATENT DOCUMENTS 976353 10/1975 Canada ................................. 430/299

OTHER PUBLICATIONS

In re Hallman, 210 USPQ 609, decided 7/16/1981, (Ser. No. 350,372, filed 4/12/73 and pending in PTO as of 1/15/1982).
Chemical Abstracts, vol. 79, #110318Y, 1973.
Chemical Abstracts, vol. 82, #37355p, 1975.

Primary Examiner—Charles L. Bowers, Jr.
Attorney, Agent, or Firm—Birch, Stewart, Kolasch & Birch

[57] ABSTRACT

A method for Te pattern formation in the manufacture of a thin-film transistor having a semiconductor layer of Te. Developing and etching of the substrate having the Te layer and a resist layer overlaying the Te layer are simultaneously carried out by the use of a developing and etching solution after having been exposed to rays of UV-light.

26 Claims, 5 Drawing Figures

METHOD FOR FORMING A PATTERN IN A THIN-FILM TRANSISTOR HAVING TELLURIUM SEMICONDUCTOR LAYER

BACKGROUND AND SUMMARY OF THE INVENTION

The present invention generally relates to a method for manufacturing a thin-film transistor and, more particularly, to a method for the formation of a pattern of a semi-conductor layer made of tellurium (Te).

In general, a thin-film pattern formation is carried out by the employment of either a masked vapor deposition technique or a photolithographic technique. The photolithographic technique is generally recognized as a more effective and better technique than the masked vapor evaporation technique, so far as the precision of the resultant pattern and the applicability to mass production are concerned. For the purpose of the discussion of the present invention, the prior art methods for making some thin-film transistors will first be described with reference to FIGS. 1 to 4 of the accompanying drawings, all of said prior art methods utilizing the photolithographic technique.

Referring first to FIG. 1, there is shown, in a cross-sectional representation, a thin-film transistor generally referred to as a so-called "inverted-staggered type." This type of thin-film transistor is manufactured by forming a thin film of metal, such as aluminum (Al), tantalum (Ta), hafnium (Hf), titanium (Ti) or zirconium (Zr), on a substrate made of, for example, glass by the use of an electron beam deposition technique or a sputtering technique, and then forming a pattern by the use of a so-called wet-etching technique or a so-called dry-etching technique to give a gate electrode 2. The patterned gate electrode 2 so formed on the substrate 1 is then anode-oxidized to form an oxide insulating layer 3 on the gate electrode 2. The formation of the insulating layer 3 on the gate electrode 2 may be carried out by the use of the electron beam deposition technique or the sputtering technique other than the anodization technique. Thereafter, by the employment of a lift-off technique, a semiconductor layer 4 is formed on the insulating layer 3 using Te as a material. The final step is to form source and drain electrodes 5 using gold (Au) or nickel (Ni) as a material therefor, thereby completing the thin-film transistor.

Shown in FIG. 2 is a thin-film transistor of a so-called "coplanar type." This type of thin-film transistor is manufactured by forming a thin film of metal, such as Al, Ta, Hf, Ti or Zr, on a glass substrate 1 by the use of the electron beam deposition technique or the sputtering technique, followed by a pattern formation by the use of either the wet-etching technique or the dry-etching technique to form a gate electrode 2. The formation of the gate electrode 2 may be carried out by the use of the masked vacuum evaporation technique. Subsequent thereto, an oxide insulating layer 3 is formed on the gate electrode 2 by the use of the anodization technique. Either a vacuum evaporation technique or a sputtering technique may also be employable to form the insulating layer 3 in place of the anodization technique. Thereafter, a thin metal layer of Au or Ni is formed on the insulating layer 3 in any known manner, followed by the formation of source and drain electrodes 5. The final step is to form a semiconductor layer 4 of Te by the use of the lift-off technique, thereby completing the thin-film transistor of coplanar type.

A thin-film transistor of a construction shown in section in FIG. 3 is also known. This type of thin-film transistor shown in FIG. 3 is manufactured by forming a thin film of metal, such as Al, Ta, Hf, Ti or Zr, on a glass substrate 1 by the use of the electron beam deposition technique or the sputtering technique, followed by the pattern formation by the use of the dry-etching or the wet-etching technique to form a gate electrode 2. The formation of the gate electrode 2 may be carried out by the use of the masked vacuum evaporation technique. An insulating layer 3 is subsequently formed on the gate electrode by the use of either the anodization technique or one of the vacuum evaporation technique and the sputtering technique, followed by the formation of source and drain electrodes 5 by forming thin metal layer of Au or Ni in any known manner. The final step is to form a semiconductor layer 4 of Te on both of the source and drain electrodes 5 and the insulating layer 3 by the use of the lift-off technique. This semiconductor layer 4 may also be formed by the use of the masked vacuum evaporation technique.

The pattern formation of the semiconductor layer 4 according to any one of the methods shown in FIGS. 1 to 3 is carried out in a manner shown in FIG. 4.

According to the prior art, the pattern formation of the Te semiconductor layer 4 is carried out by first applying a resist material on a substrate to be patterned by the use of a spinner as shown in a step n1 in FIG. 4. The used resist material is manufactured and sold under the trade name "AZ-1350" by Shipley Company Inc. of U.S.A. and is so coated with about 0.6 μm in thickness. The subsequent step n2 in FIG. 4 is to subject the substrate with the resist material applied thereon to a soft-baking process for 15 minutes at 90° C., followed by exposure for 10 seconds to a 500 W-super high pressure mercury lamp at a step n3 in FIG. 4, the exposed resist on the substrate being then developed as shown in step n4 in FIG. 4. The developing of the exposed resist on the substrate is carried out for about 60 seconds at ambient (or room) temperature by the use of an aqueous solution containing an equal amount of distilled water and a developing agent manufactured and sold under the trade name "AZ Developer" by Shipley Company Inc. of U.S.A. At a step n5 in FIG. 4 followed by the step n4 in FIG. 4, the developed substrate is flushed with water and, thereafter, that is, at a step n6 in FIG. 4, the washed substrate is post-baked for 15 minutes at 110° C. At a step n7 in FIG. 4 followed by the step n6 in FIG. 4, Te is vacuum-deposited on the substrate (Substrate Temperature: Ambient temperature. Pressure: $2 \times 10^{-5}$ Torr. Deposition rate: 4 Å/sec.), followed by the final step n8 in FIG. 4 during which the Te-deposited substrate is subjected to an ultrasonic cleaning two times to remove the unwanted portion of the Te layer on the substrate, thereby completing the pattern formation.

BRIEF DESCRIPTION OF THE DRAWINGS

Objects and features of the present invention will become apparent from the following description taken in conjunction with a preferred embodiment thereof with reference to the accompanying drawings, in which.

DETAILED DESCRIPTION OF THE INVENTION

Figure 1:
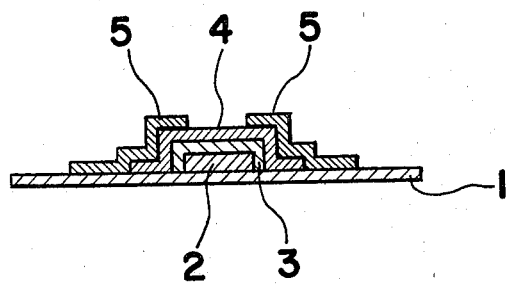
FIGS. 1 to 3 are sectional views of commercially available three types of thin-film transistors, respectively.
Figure 2:
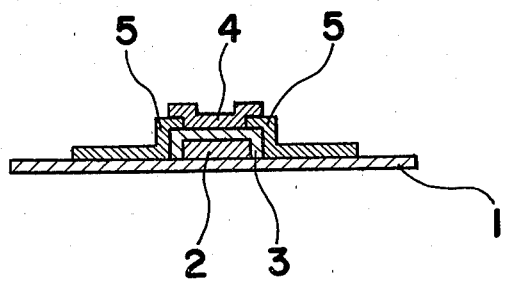
Figure 3:
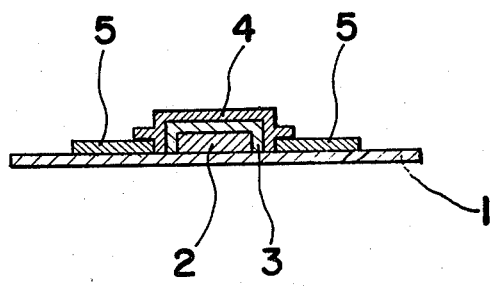
Figure 4:
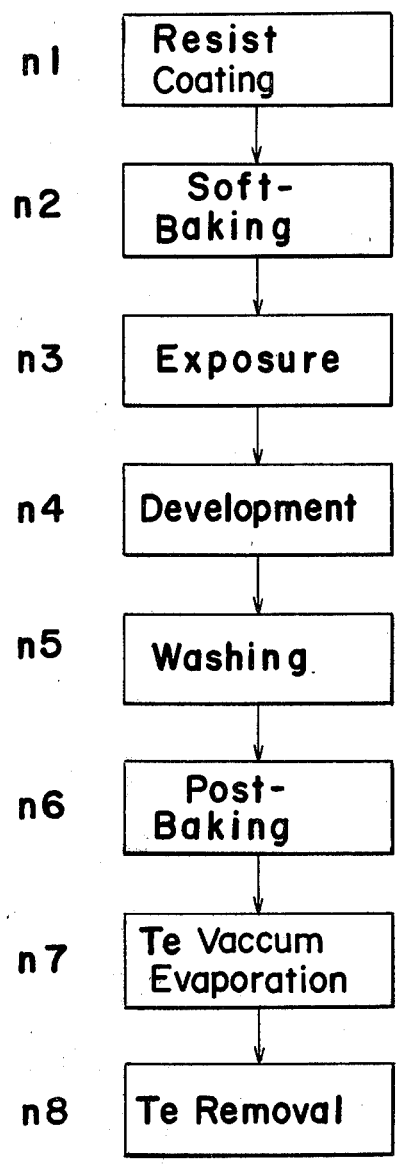
FIG. 4 is a chart showing the prior art process of pattern formation in any one of the transistors shown respectively in FIGS. 1 to 3.

Before the description of the present invention proceeds, it is to be noted that like parts are designated by like reference numerals throughout the accompanying drawings.

As discussed above, the pattern formation according to the prior art requires the eight steps to be performed in sequence. However, the present invention is featured in that the method required to carry out the pattern formation is minimized by simultaneously carrying out the development and the etching with the use of an alkaline solution. This will now be described.

Figure 5:
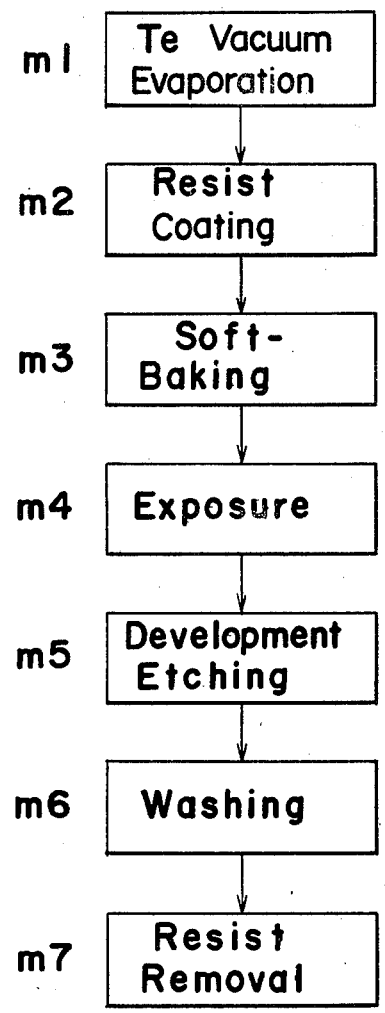
FIG. 5 is a chart similar to FIG. 4, but according to the present invention.

Referring now to FIG. 5, the pattern formation according to the present invention is carried out by first vacuum-evaporating Te on a substrate to be patterned (Substrate Temperature: Ambient Temperature. Deposition rate: 4 Å/sec. Pressure: $2 \times 10^{-5}$ Torr.) as shown in a step m1 in FIG. 5. The step m1 in FIG. 5 is followed by a step m2 in FIG. 5 during which an o-quinone diazide containing resist material, "AZ-1350" available from Shipley Company Inc. of U.S.A., is coated with a thickness of about 0.6 μm by the use of a spinner. At the subsequent step m3 in FIG. 5, the resist-coated substrate is soft-baked for 15 minutes at, for example, 90° C., followed by a step m4 in FIG. 5 during which the soft-baked resist on the substrate is exposed for about 10 seconds to actinic radiation with a 500 W-super high pressure mercury lamp. Thereafter and at a step m5 in FIG. 5, both development and etching are simultaneously carried out on the substrate for 30 to 400 seconds by the use of a developing and etching solution. Subsequent to the step m6 in FIG. 5 during which the developed and etched substrate has been rinsed with water, the final step m7 in FIG. 5 is carried out to remove the resist layer on the substrate by the use of an organic solvent, such as acetone or "Butyl Cellosolve"-®(ethylene glycol monobutyl ether), thereby completing the Te pattern formation.

The developing and etching solution should contain one or a mixture of the following compounds (1) to (6):

(1) inorganic hydroxides such as sodium hydroxide, potassium hydroxide, barium hydroxide, magnesium hydroxide or calcium hydroxide;

(2) silicates such as sodium silicate or potassium silicate;

(3) phosphates such as sodium phosphate or potassium phosphate;

(4) organic bases such as quaternary ammonium salts including tetramethylammonium hydroxide, tetraethylammonium hydroxide, tetrapropylammonium hydroxide, tetrabutylammonium hydroxide, ethyltripropylammonium hydroxide, n-decyltrimethylammonium hydroxide, n-decyltriethylammonium hydroxide, n-dodecyltrimethylammonium hydroxide, n-dodecyltriethylammonium hydroxide, n-hexadecyltrimethylammonium hydroxide, and n-hexadecyltriethylammonium hydroxide;

(5) monobasic strong bases such as tetrahydroparaoxazine and 3-methyltetrahydroparaoxazine;

(6) water-soluble basic amines such as lower alkyl amines including methylamine, ethylamine, propylamine and butylamine, basic amines including monoethanolamine, diethanolamine and triethanolamine, or water-soluble alcohols such as aliphatic primary alcohols including methanol, ethanol, propyl, alcohol, butyl alcohol, amyl alcohol, aliphatic polyhydric alcohols including ethylene glycol, diethylene glycol, triethylene glycol, glycerol and pentaerythritol, or cyclic alcohols including cyclohexanol and benzyl alcohol.

Hereinafter, the present invention will be described by way of examples which are set forth only for the purpose of illustration and, therefore, are to be understood as not limiting the scope of the present invention.

EXAMPLE 1

An aqueous solution of the composition shown in Table 1 is prepared.

TABLE 1

| Composition | Content (g/l %) |
|---|---|
| NaOH | 2 |
| Na$_2$SiO$_3$ | 23.6 |
| Na$_3$PO$_4$ | 9.8 |
| Distilled Water | 64.6 |

A solution similar in composition to that shown in Table 1 is commercially available in the form of "AZ Developer" from Shipley Company Inc. of U.S.A. The aqueous solution of the composition shown in Table 1 or the "AZ Developer" is subsequently diluted double with distilled water to provide the developing and etching solution.

Separately of the preparation of the developing and etching solution, a substrate to be formed with a Te pattern is deposited with a layer of Te by the use of the vacuum evaporation technique (Substrate Temp.: Ambient Temp. Deposition rate: 4 Å/sec.

Pressure: $2 \times 10^{-5}$ Torr. Film Thickness ≃ 100 Å). Subsequently, a layer of resist material ("AZ-1350" available from Shipley Company Inc. of U.S.A.), 0.6 μm in thickness, is applied by the use of a spinner on the substrate so as to overlay the Te layer. Thereafter, the resist layer so formed is dried at 90° C. for 15 minutes in a drier of hot-air circulating type, followed by exposure for 10 seconds to a 500 W-super high pressure mercury lamp.

Subsequent to the exposure to the UV-lamp, the developing and etching are simultaneously carried out at 20° C. for a time specified in Table 2 by the use of the developing and etching solution separately prepared in the manner described above. The result of the developing and etching is shown in Table 2.

TABLE 2

| Solution | Time | Result |
|---|---|---|
| Diluted Double | about 70 sec. | excellent |

After the development and etching, the substrate is washed with distilled water, followed by the removal of the resist layer in an acetone bath by the use of ultrasonic waves. By so doing, a precisely formed desired pattern can be obtained.

EXAMPLE 2

An aqueous solution of the composition shown in Table 3 is prepared.

TABLE 3

| Composition | Content (g/l %) |
| --- | --- |
| (CH₃)₄NOH | 5 |
| Morpholine | 1~2 |
| Coumarin | 0.04 |
| Surfactant | ~0.1 |
| Distilled water | 92.86~93.96 |

A solution similar in composition to that shown in Table 3 is commercially available in the form of developers identified by "MF-312" and "MF-324" respectively from Shipley Company Inc. of U.S.A. The aqueous solution of the composition shown in Table 3 is subsequently diluted double or triple with distilled water to provide the developing and etching solution.

Separately of the preparation of the developing and etching solution, a substrate to be formed with a Te pattern is deposited with a layer of Te by the use of the vacuum evaporation technique (Substrate Temp.:
Ambient Temp. Deposition rate: 4 Å/sec.
Pressure: $2 \times 10^{-5}$ Torr. Film Thickness≃100 Å). Subsequently, a layer of resist material ("AZ-1350" available from Shipley Company Inc. of U.S.A.), 0.6 μm in thickness, is applied by the use of a spinner on the substrate so as to overlay the Te layer. Thereafter, the resist layer so formed is dried at 90° C. for 15 minutes, followed by exposure for 10 seconds to UV-light.

Subsequent to the exposure to the UV-light, the developing and etching are simultaneously carried out at 20° C. for a time specified in Table 4 by the use of the developing and etching solution separately prepared in the manner described above. The result of the developing and etching is shown in Table 4.

TABLE 4

| Solution | Time | Results |
| --- | --- | --- |
| Diluted Double | 15 sec. | Te layer partially unremoved |
| Diluted Double | 30–40 sec. | Excellent |
| Diluted Triple | 30 sec. | Resist layer partially unremoved |
| Diluted Triple | 60 sec. | Both Te layer and resist layer partially unremoved |
| Diluted Triple | 90 sec. | Good |
| Diluted Triple | 360 sec. | Excellent |

After the development and etching, the substrate is washed with distilled water, followed by the removal of the resist layer in an acetone bath by the use of ultrasonic waves. By so doing, a precisely formed desired pattern can be obtained.

From the Table 4 above, it will readily be understood that the favorable Te pattern can be obtained when the developing and etching is carried out for 30 to 40 seconds in the case where the developing and etching solution diluted double with distilled water is used, and for 360 seconds in the case where the developing and etching solution diluted triple with distilled water is used.

EXAMPLE 3

Using a developing solution containing a mixture of water-soluble amine and water-soluble alcohol, which is manufactured and sold under the trade name "NM-20" by Tokyo Ohka Co., Ltd. of Japan, the developing and etching process was carried out in the same manner as in Example 2, the result of which is shown in Table 5.

TABLE 5

| Time | Result |
| --- | --- |
| 180 sec. | Te layer partially unremoved |
| 360 400 sec. | Excellent |

From the foregoing, it has now become clear that the Te pattern formation is carried out in the reduced number of the process steps as compared with that according to the prior art. This is possible because the developing and etching are simultaneously carried out by the same solution. Because of the reduced number of the process steps, any possible contamination of thin-film transistors can advantageously be minimized.

Although the present invention has been described by way of examples, it is to be noted that various changes and modifications are apparent to those skilled in the art. Unless they depart from the true scope of the present invention as defined by the appended claims, they are to be construed as included therein.

What is claimed is:

1. A method for making a patterned tellurium semiconductor layer, comprising the steps of:
   depositing a tellurium semiconductor layer on a substrate;
   forming a photoresist layer, selected portions of said photoresist layer being soluble upon exposure to actinic radiation in an aqueous basic developing and etching solution consisting essentially of an effective amount of compounds selected from the group consisting of inorganic hydroxides, silicates, phosphates, organic bases, monobasic strong bases, water soluble basic amines, water soluble alcohols and mixtures thereof;
   soft baking the substrate having both the tellurium and photoresist layer thereon;
   exposing selected portions of the photoresist to actinic radiation to form a pattern in the photoresist;
   contacting the thus exposed device with said aqueous basic developing and etching solution to selectively remove the exposed portions of said photoresist and to selectively etch the corresponding portions of said tellurium semiconductor layer;
   washing the resultant device; and
   contacting the remaining resist layer with an organic solvent to remove the remaining resist layer.

2. A method according to claim 1, wherein said aqueous basic developing and etching solution consists essentially of inorganic hydroxide, silicate, phosphate, organic base, monobasic strong base and mixtures thereof.

3. A method according to claim 1, wherein said aqueous developing and etching solution contains an inorganic hydroxide, a silicate and a phosphate.

4. A method according to claim 1, wherein said aqueous developing and etching solution contains a quaternary ammonium salt organic base.

5. A method according to claim 1, wherein said aqueous basic developing and etching solution contains a water-soluble basic amine and a water-soluble alcohol.

6. A method according to claim 1, wherein said tellurium semiconductor material has a thickness of about 100 Angstroms.

7. A method according to claim 1, wherein said inorganic hydroxides are selected from the group consisting of sodium hydroxide, potassium hydroxide, barium hydroxide, magnesium hydroxide and calcium hydroxide; said silicates are selected from the group consisting of sodium silicate and potassium silicate; said phosphates are selected from the group consisting of sodium phosphate and potassium phosphate; and said organic bases are quaternary ammonium salts.

8. A method according to claim 1, wherein said aqueous developing and etching solution contains quaternary ammonium salts selected from the group consisting of tetramethylammonium hydroxide, tetraethylammonium hydroxide, tetrapropylammonium hydroxide, tetrabutylammonium hydroxide, ethyltripropylammonium hydroxide, n-decyltrimethylammonium hydroxide, n-decyltriethylammonium hydroxide, n-dodecyltrimethylammonium hydroxide, n-dodecyltriethylammonium hydroxide, n-hexadecyltrimethylammonium hydroxide, and n-hexadecyltriethylammonium hydroxide.

9. A method for making a thin-film transistor, comprising the steps of:
forming a source electrode, a drain electrode, a gate electrode and a tellurium semiconductor layer, wherein the tellurium semiconductor layer is made by a process consisting essentially of the following steps:
depositing a tellurium semiconductor layer on a substrate;
forming a photoresist layer, selected portions of said photoresist layer being soluble upon exposure to ultraviolet light in an aqueous basic developing and etching solution consisting essentially of an effective amount of compounds selected from the group consisting of inorganic hydroxides, silicates, phosphates, organic bases, monobasic strong bases, water soluble basic amines, water soluble alcohols and mixtures thereof;
soft baking the substrate having both the tellurium and photoresist layer thereon;
exposing selected portions of the photoresist to ultraviolet light to form a pattern in the photoresist;
contacting the thus exposed device with said aqueous basic developing and etching solution to selectively remove the exposed portions of said photoresist and to selectively etch the corresponding portions of said tellurium semiconductor layer;
washing the resultant device; and
contacting the remaining resist layer with an organic solvent to remove the remaining resist layer.

10. A method according to claim 9, wherein said aqueous basic developing and etching solution consists essentially of inorganic hydroxide, silicate, phosphate, organic base, monobasic strong base and mixtures thereof.

11. A method according to claim 9, wherein said aqueous developing and etching solution contains an inorganic hydroxide, a silicate and a phosphate.

12. A method according to claim 9, wherein said aqueous developing and etching solution contains a quaternary ammonium salt organic base.

13. A method according to claim 9, wherein said aqueous basic developing and etching solution contains a water-soluble basic amine and a water-soluble alcohol.

14. A method according to claim 9, wherein said tellurium semiconductor material has a thickness of about 100 Angstroms.

15. A method according to claim 9, wherein said inorganic hydroxides are selected from the group consisting of sodium hydroxide, potassium hydroxide, barium hydroxide, magnesium hydroxide and calcium hydroxide; said silicates are selected from the group consisting of sodium silicate and potassium silicate; said phosphates are selected from the group consisting of sodium phosphate and potassium phosphate; and said organic bases are quaternary ammonium salts.

16. A method according to claim 9, wherein said aqueous developing and etching solution contains quaternary ammonium salts selected from the group consisting of tetramethylammonium hydroxide, tetraethylammonium hydroxide, tetrapropylammonium hydroxide, tetrabutylammonium hydroxide, ethyltripropylammonium hydroxide, n-decyltrimethylammonium hydroxide, n-decyltriethylammonium hydroxide, n-dodecyltrimethylammonium hydroxide, n-dodecyltriethylammonium hydroxide, n-hexadecyltrimethylammonium hydroxide, and n-hexadecyltriethylammonium hydroxide.

17. A method according to claim 9, wherein said exposed device is contacted with said aqueous basic developing and etching solution for 30 to 400 seconds.

18. A method according to claim 17, wherein said tellurium semiconductor layer is deposited by vacuum evaporation.

19. A method according to claim 9, wherein said photoresist contains a quinone diazide.

20. A method according to claim 9, wherein said photoresist contains o-quinone diazide.

21. A method according to claim 9, wherein said aqueous basic developing and etching solution contains a lower alkyl amine.

22. A method according to claim 9, wherein said aqueous basic developing and etching solution contains an amine selected from the group consisting of monoethanolamine, diethanolamine and triethanolamine.

23. A method according to claim 9, wherein said aqueous basic developing and etching solution contains a water-soluble alcohol selected from the group consisting of aliphatic primary alcohols, aliphatic polyhydric alcohols and cyclic alcohols.

24. A method for making a patterned tellurium semiconductor layer, comprising the steps of:
depositing a tellurium semiconductor layer on a substrate by vacuum evaporation;
forming a photoresist layer, selected portions of said photoresist layer being soluble upon exposure to actinic radiation in an aqueous basic developing and etching solution consisting essentially of an effective amount of compounds selected from the group consisting of inorganic hydroxides, silicates, phosphates, organic bases, monobasic strong bases, water soluble basic amines, water soluble alcohols and mixtures thereof;
soft baking the substrate having both the tellurium and photoresist layer thereon;
exposing selected portions of the photoresist to ultraviolet light to form a pattern in the photoresist;
contacting the thus exposed device with said aqueous basic developing and etching solution for 30 to 400 seconds to selectively remove the exposed portions of said photoresist and to selectively etch the corresponding portions of said tellurium semiconductor layer;
washing the resultant device with water; and
contacting the remaining resist layer with an organic solvent to remove the remaining resist layer.

25. A method for making a thin-film transistor, comprising the steps of:
forming a source electrode, a drain electrode, a gate electrode and a tellurium semiconductor layer, wherein the tellurium semiconductor layer is made by a process consisting essentially of the following steps:

depositing a tellurium semiconductor layer on a substrate by vacuum evaporation;

forming a photoresist layer, selected portions of said photoresist layer being soluble upon exposure to actinic radiation in an aqueous basic developing and etching solution consisting essentially of an effective amount of compounds selected from the group consisting of inorganic hydroxides, silicates, phosphates, organic bases, monobasic strong bases, water soluble basic amines, water soluble alcohols and mixtures thereof;

soft baking the substrate having both the tellurium and photoresist layer thereon;

exposing selected portions of the photoresist to ultraviolet light to form a pattern in the photoresist;

contacting the thus exposed device for 30 to 400 seconds with said aqueous basic developing and etching solution to selectively remove the exposed portions of said photoresist and to selectively etch the corresponding portions of said tellurium semiconductor layer;

washing the resultant device with water; and contacting the remaining resist layer with an organic solvent to remove the remaining resist layer.

26. A method according to claim 24 or 25, wherein said photoresist comprises o-quinone diazide.

* * * * *